US010283447B1

(12) United States Patent
Groening et al.

(10) Patent No.: US 10,283,447 B1
(45) Date of Patent: May 7, 2019

(54) POWER SEMICONDUCTOR MODULE WITH PARTIALLY COATED POWER TERMINALS AND METHOD OF MANUFACTURING THEREOF

(71) Applicant: Infineon Technologies AG, Neubiberg (DE)

(72) Inventors: Torsten Groening, Paderborn (DE); Thomas Nuebel, Warstein (DE); Reinhold Spanke, Bestwig (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/795,077

(22) Filed: Oct. 26, 2017

(51) Int. Cl.
| | | |
|---|---|---|
| *H01L 23/50* | (2006.01) |
| *H01L 25/07* | (2006.01) |
| *H01L 21/48* | (2006.01) |
| *H01L 25/00* | (2006.01) |
| *H01L 23/055* | (2006.01) |

(52) U.S. Cl.
CPC .......... *H01L 23/50* (2013.01); *H01L 21/4817* (2013.01); *H01L 23/055* (2013.01); *H01L 25/072* (2013.01); *H01L 25/50* (2013.01)

(58) Field of Classification Search
CPC ......... H04N 5/378; H01L 51/56; H01L 43/08; H01L 51/0072; H01L 51/5012
USPC .......................................... 257/691
See application file for complete search history.

(56) References Cited

U.S. PATENT DOCUMENTS

| 8,338,942 | B2 | 12/2012 | Lederer et al. | |
|---|---|---|---|---|
| 9,640,461 | B1* | 5/2017 | Spann | H01L 24/48 |
| 2010/0065962 | A1* | 3/2010 | Bayerer | H01L 23/3735 257/703 |
| 2011/0115068 | A1* | 5/2011 | Hartung | H01L 24/32 257/690 |
| 2012/0106086 | A1* | 5/2012 | Schloerke | H01L 25/072 361/715 |
| 2014/0151868 | A1* | 6/2014 | Bayerer | H01L 23/02 257/690 |

(Continued)

FOREIGN PATENT DOCUMENTS

| DE | 102014104856 A1 | 10/2015 |
|---|---|---|
| EP | 1868243 B1 | 12/2008 |

(Continued)

*Primary Examiner* — Andy Huynh
(74) *Attorney, Agent, or Firm* — Murphy, Bilak & Homiller, PLLC

(57) ABSTRACT

A power semiconductor module includes one or more power semiconductor dies attached to a first main face of a substrate, a plastic housing attached to the substrate, which together with the substrate encloses the one or more power semiconductor dies, a plurality of power terminals attached to the first main face of the substrate at a first end, and extending through the plastic housing at a second end to provide a point of external electrical connection for the one or more power semiconductor dies, a potting compound embedding the one or more power semiconductor dies, the first main face of the substrate and at least part of the first end of the plurality of power terminals, and an insulative coating applied only to parts of the plurality of power terminals disposed inside the plastic housing and in contact with just air. A corresponding method of manufacture also is provided.

22 Claims, 5 Drawing Sheets

(56) References Cited

U.S. PATENT DOCUMENTS

2015/0001700 A1    1/2015  Hartung et al.
2015/0092380 A1*   4/2015  Hohlfeld .............. H05K 3/4697
                                                        361/783

FOREIGN PATENT DOCUMENTS

JP          2000216332 A     8/2000
JP          2002217362 A     8/2002

* cited by examiner

POWER SEMICONDUCTOR MODULE WITH PARTIALLY COATED POWER TERMINALS AND METHOD OF MANUFACTURING THEREOF

TECHNICAL FIELD

The present application relates to power semiconductor modules, and particularly to power semiconductor modules with partially coated power terminals.

BACKGROUND

A power semiconductor module provides the physical containment for several power semiconductor devices such as one or more power MOSFETs (metal-oxide-semiconductor field-effect transistors), IGBTs (insulated gate bipolar transistors), BJTs (bipolar junction transistors), thyristors, JFETs (junction field-effect transistors), diodes, etc. The power semiconductor devices are typically fabricated in one or more semiconductor dies which are attached to a power electronic substrate. A plastic housing, along with the substrate, enclose the power semiconductor devices.

Within a power semiconductor module, sufficient isolation distances between the electric potentials must be realized to ensure proper performance, safety and reliability. Due to limited space in the inner volume of a power semiconductor module, free air does not provide sufficient isolation between components under electrical voltage.

A soft potting isolation compound is often used to electrically insulate all exposed areas requiring electrical insulation. The filling height of the potting compound inside a power semiconductor module directly depends on the inner construction of the module. The need for fulfilling all other requirements as manufacturability of the plastic housing, processability and compatibility to existing production processes during manufacturing of a power semiconductor module generally results in higher filling heights of the potting compound, which adversely affects lifetime performance of the module. Thermal expansion of the potting material, for example, can cause substantial mechanical interactions between components with different thermal expansion coefficients, and even significant thermomechanical stress in the potting material itself. Under application conditions for an IGBT-based power semiconductor module, propagation of cracks in the potting material is a real concern which can lead to insulation failure of the module.

Hence, there is a need for a power semiconductor module with more reliable electrical insulation.

SUMMARY

According to an embodiment of a power semiconductor module, the power semiconductor module comprises: one or more power semiconductor dies attached to a first main face of a substrate; a plastic housing attached to the substrate, the plastic housing and the substrate together enclosing the one or more power semiconductor dies; a plurality of power terminals attached to the first main face of the substrate at a first end, and extending through the plastic housing at a second end to provide a point of external electrical connection for the one or more power semiconductor dies; a potting compound embedding the one or more power semiconductor dies, the first main face of the substrate and at least part of the first end of the plurality of power terminals; and an insulative coating applied only to parts of the plurality of power terminals disposed inside the plastic housing and in contact with just air.

According to an embodiment of a method of manufacturing a power semiconductor module, the method comprises: attaching one or more power semiconductor dies to a first main face of a substrate; attaching a plastic housing to the substrate, the plastic housing and the substrate together enclosing the one or more power semiconductor dies; attaching a plurality of power terminals to the first main face of the substrate at a first end, each power terminal extending through the plastic housing at a second end to provide a point of external electrical connection for the one or more power semiconductor dies; embedding the one or more power semiconductor dies, the first main face of the substrate and at least part of the first end of the plurality of power terminals in a potting compound; and prior to attaching the plurality of power terminals to the first main face of the substrate, applying an insulative coating only to parts of the plurality of power terminals to be disposed inside the plastic housing and in contact with just air.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Embodiments described herein provide a power semiconductor module having power terminals that are partially coated with an insulative material, and a corresponding method of manufacture. The insulative coating is omitted from those areas of the power terminals for realizing electrical contacts within the module and to an external bulbar. Additionally, areas of the power terminals that have either direct contact to a potting compound included in the module or that are electrically isolated by plastic components of the module housing, are also not coated with the insulative material. This way, application of the insulative material to the power terminals can be selectively optimized with respect to the physical conditions and layer thicknesses of the module. Furthermore, the height of the potting compound inside the module can be reduced, decreasing the likelihood of thermomechanical damage to the potting compound within the module.

Figure 1:
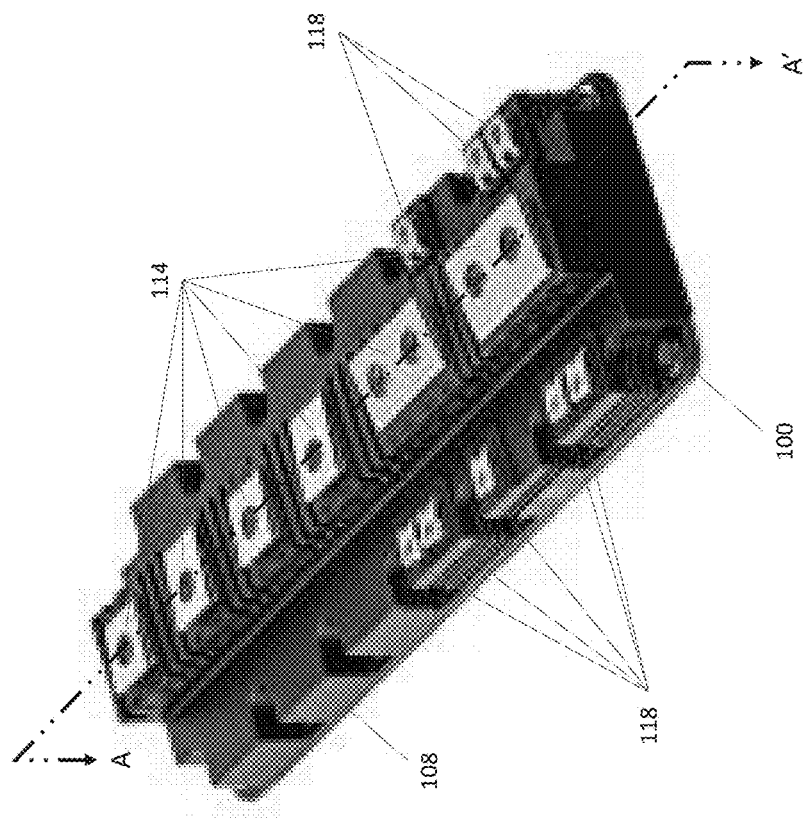
FIG. 1 illustrates a perspective view of an embodiment of a power semiconductor module having power terminals that are partially coated with an insulative material.

FIG. 1 illustrates a perspective view of an embodiment of a power semiconductor module having power terminals that are partially coated with an insulative material.

Figure 2:
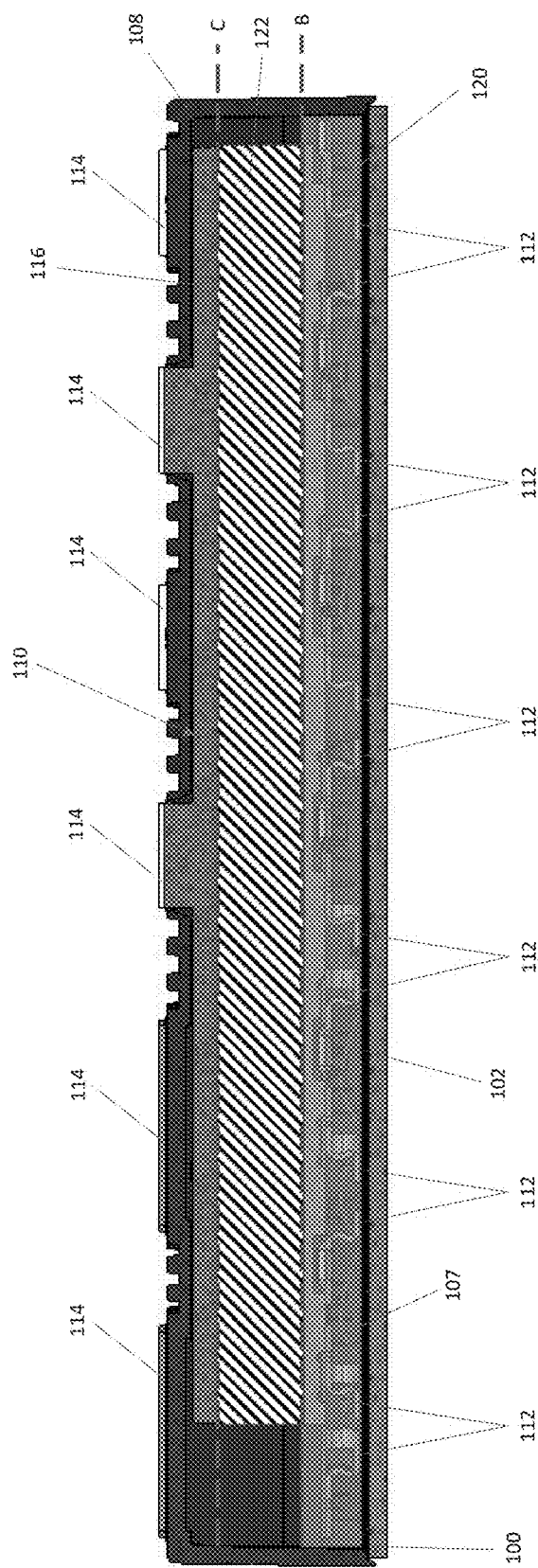
FIG. 2 illustrates a cross-sectional view of the power semiconductor module along the line labeled A-A' in FIG. 1.

FIG. 2 illustrates a cross-sectional view of the power semiconductor module along the line labeled A-A' in FIG. 1.

Figure 3:
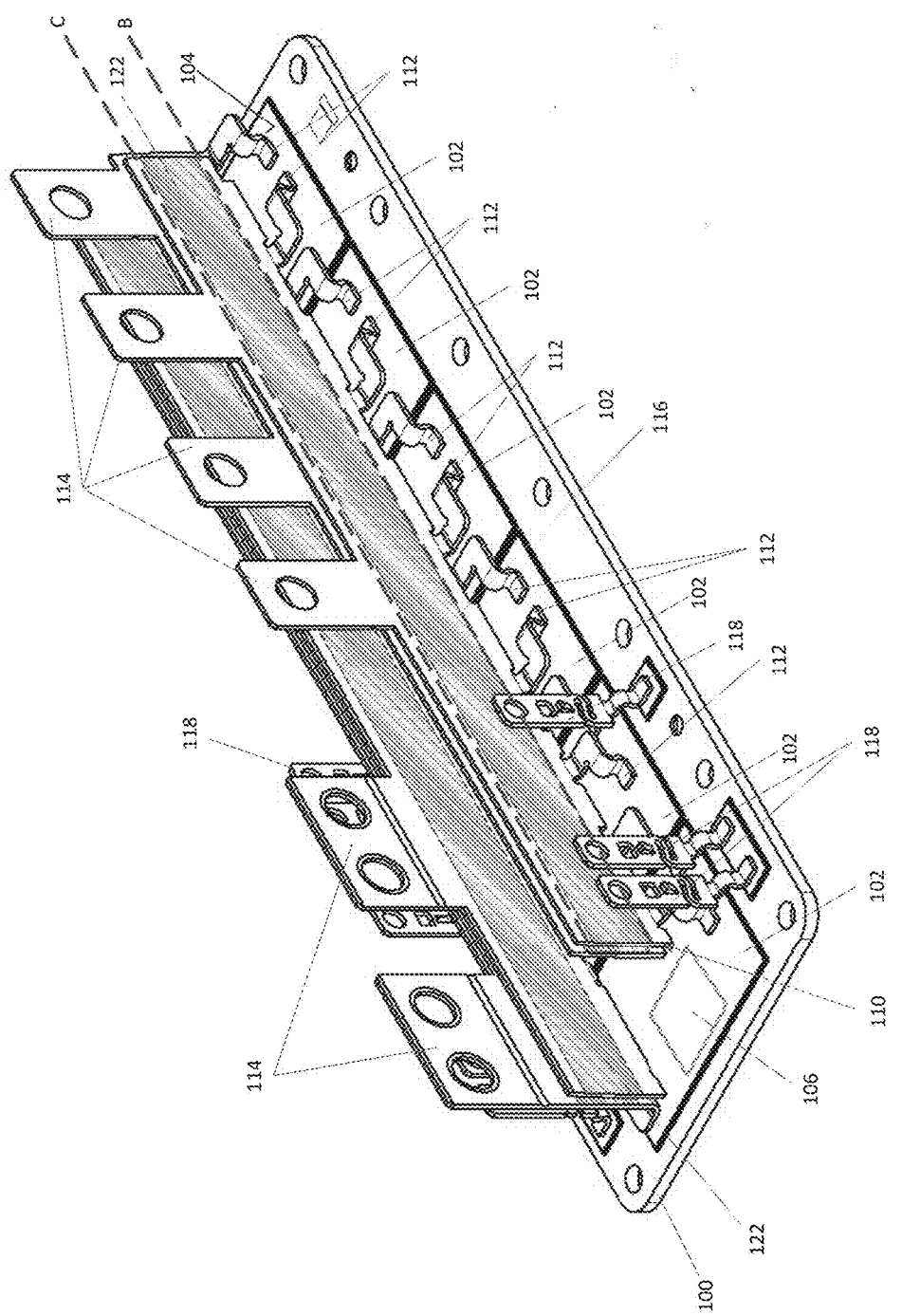
FIG. 3 illustrates a perspective view of the power semiconductor module in FIG. 1 with the housing, internal potting compound and some internal electrical connections not shown for ease of illustration.

FIG. 3 illustrates a perspective view of the power semiconductor module with the housing, internal potting compound and some internal electrical connections not shown for ease of illustration.

The power semiconductor module includes a base plate 100 and a plurality of substrates 102 each having a bottom metallized side (out of view) attached to the base plate 100, e.g., via solder, brazing material, etc. The base plate 100 is thermally conductive, and can be electrically conductive or insulative. For example, the base plate 100 can be a metal block or a ceramic such as $Al_2O_3$ or AlN.

Each substrate 102 has an opposing top metallized side 104, which can comprise the same or different material as the metallized bottom side. For example, each substrate 102 can be a standard DCB (direct copper bonded), DAB (direct aluminum bonded), AMB (active metal brazed) or IMS (insulated metal substrate) substrate. A standard DCB substrate includes copper surfaces applied to the top and bottom areas of an isolation material such as $Al_2O_3$ or AlN ceramic material. A standard DAB substrate includes aluminum surfaces applied to the top and bottom areas of a ceramic material. A standard AMB substrate includes metal foils brazed to opposing sides of an isolation material such as an AlN ceramic material. A standard IMS substrate includes an isolation material such as a polymer directly connected to the base plate 100. In each case, the metallized top side 104 of each substrate 102 can be patterned so that more than one power semiconductor die 106 can be attached to the metallized top side 104. Instead of multiple substrates, all power semiconductor dies 106 can be attached to the top metallized side 104 of a single substrate.

At least some of the power semiconductor dies 106 include one or more power semiconductor devices such as power MOSFETs, IGBTs, BJTs, thyristors, JFETs, diodes, etc. Other ones of the power semiconductor dies 106 can be passive devices such as capacitor dies and/or inductor dies. The power semiconductor dies 106 can be fabricated from any type of semiconductor material such as single element semiconductors (e.g. Si, Ge, etc.), silicon-on-insulator semiconductors, binary semiconductors (e.g. SiC, GaN, GaAs, etc.), ternary semiconductors, etc. with or without epitaxial layer(s).

The power semiconductor devices are electrically connected within the module to form a power circuit such as a buck converter, boost converter, half-bridge, full-bridge, three-phase bridge, switched-mode power supply, bi-directional power converter, synchronous rectifier, etc. The internal electrical connections to form the desired power circuit can be provided by electrical connections 107 internal to the module such as wire bonds, metal clips, metal ribbons, etc. Most of the internal electrical connections are not shown in the figures for ease of illustration.

The power semiconductor module also includes a plastic housing 108 attached to each substrate 102 and/or to the base plate 100. The plastic housing 108 can be formed by injection molding or other suitable process, and glued to the periphery of each substrate 102 and/or base plate 100. In one embodiment, the plastic housing 108 is a polymer lid. The plastic housing 108 and the substrates 102 together enclose the power semiconductor dies 106.

The power semiconductor module further includes a plurality of power terminals 110 attached to the top main face 104 of at least some of the substrates 102 at a first end 112. The power terminals 110 extend through the plastic housing 108 at a second end 114 to provide a point of external electrical connection for the power semiconductor dies 106 enclosed with the module. The power terminals 110 are illustrated as metal plates in the figures, but instead can be shaped like pins, posts, etc. In the case of metal plates, each metal plate 116 is disposed between the first and second ends 112, 114 of the respective power terminal 110, and extends in a direction generally perpendicular to the top main face 106 of the substrate(s) 102. The second ends 114 of the power terminals 110 are shown bent over in FIGS. 1 and 2, and shown prior to bending in FIG. 3. The second ends 114 of the power terminals 110 need not be bent, e.g. in the case of metal pins and posts. The module can include additional terminals 118 such as input signal terminals, output signal terminals, etc.

The power semiconductor module also includes a potting compound 120 in which the power semiconductor dies 106, the top main face 104 of each substrate 102 and at least part of the first end 112 of each power terminal 110 are embedded. Any standard potting compound suitable for high power semiconductor applications can be used, e.g., such as a thermosetting plastic, a silicone gel, etc. The height of the potting compound 120 is indicated by the dashed line labeled 'B' in FIGS. 2 and 3. According to the embodiment illustrated in FIGS. 2 and 3, the potting compound covers the lower part of each terminal metal plate 116 below the dashed line labeled 'B'. In general, the potting compound 120 may have any desired height. The potting compound 120 is not shown in FIG. 3, so that other aspects of the invention are more visible in this illustration.

The power semiconductor module further includes an insulative coating 122 applied only to parts of the power terminals 110 disposed inside the plastic housing 108 and in contact with just air. As such, the insulative coating 122 is not applied to any part of the power terminals 110 disposed outside the plastic housing 108. The insulative coating 122 also is not applied to any part of the power terminals 110 disposed inside the plastic housing 108 and which are in contact with the potting compound 120 or the plastic housing 108.

In the embodiment illustrated in FIGS. 2 and 3, the upper part of each terminal metal plate 116 is in contact with the plastic housing 108 and the lower part of each terminal metal plate 116 is embedded in the potting compound 120. The dashed line labeled 'C' in FIGS. 2 and 3 is a line of demarcation below which the plastic housing 108 does not contact the terminal metal plates 116. Likewise, the dashed line labeled 'B' in FIGS. 2 and 3 is a line of demarcation above which the potting compound 120 does not contact the terminal metal plates 116. The region of the terminal metal plates 116 disposed between lines 'A' and 'B' is in contact with just air and thus coated with the insulative material 122. The insulative coating 122 is not applied to the upper part of each terminal metal plate 116 in contact with the plastic housing 108 (above line 'C' in FIGS. 2 and 3) or to the lower part of each terminal metal plate 116 embedded in the potting compound 120 (below line 'B' in FIGS. 2 and 3). Further according to this embodiment, the insulative coating 122 is not applied to the first and second ends 112, 114 of each power terminal 110.

Figure 4:
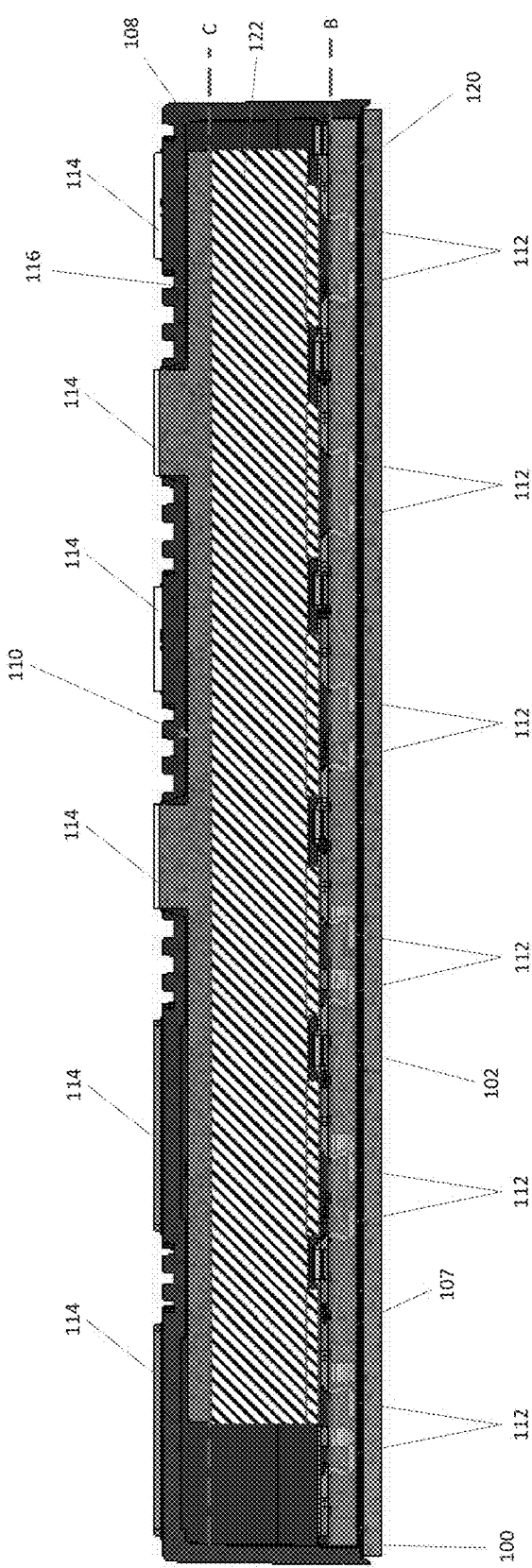
FIG. 4 illustrates a cross-sectional view of another embodiment of a power semiconductor module having power terminals that are partially coated with an insulative material.

FIG. 4 illustrates a cross-sectional view of another embodiment of a power semiconductor module having power terminals that are partially coated with an insulative material. The embodiment shown in FIG. 4 is similar to the embodiment illustrated in FIG. 2. Different, however, the potting compound 120 terminates before reaching the metal plate 116 of each power terminal 110. As such, each terminal metal plate 116 of the power semiconductor module is completely uncovered by the potting compound 120. According to this embodiment, the insulative coating 122 is applied to the (lower) part of each terminal metal plate 116 nearest the potting compound 120 but not to the (upper) part of each terminal metal plate 116 in contact with the plastic housing 108. The dashed line labeled 'C' in FIG. 4 is a line of demarcation below which the plastic housing 108 does not contact the terminal metal plates 116. Likewise, the dashed line labeled 'B' in FIG. 4 is a line of demarcation above which the potting compound 120 does not contact the terminal metal plates 116. The region of the terminal metal plates 116 disposed between lines 'A' and 'B' in FIG. 4 is in contact with just air and thus coated with the insulative material 122. Still other potting compound fill levels (heights) are contemplated.

Figure 5:
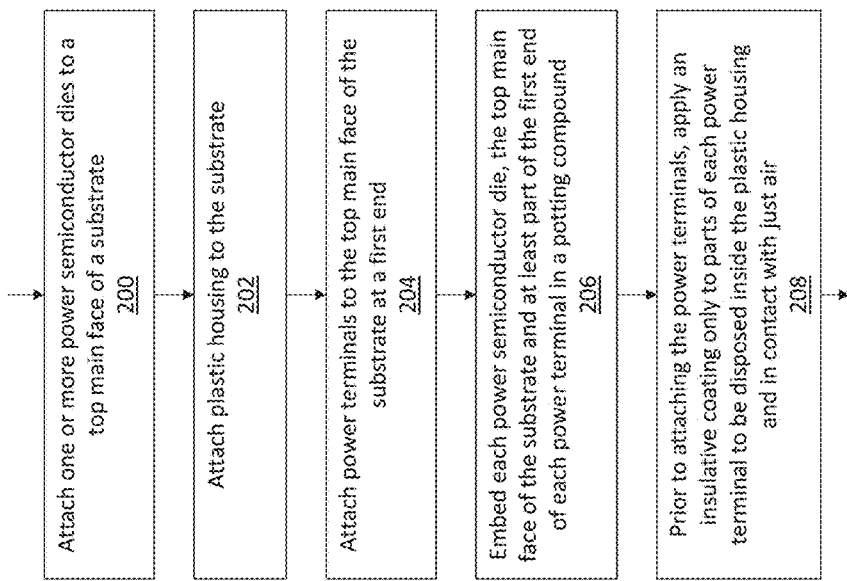
FIG. 5 illustrates an embodiment of a method of manufacturing the power semiconductor module.

FIG. 5 illustrates an embodiment of a method of manufacturing the power semiconductor modules illustrated in FIGS. 1 through 4. The method includes attaching one or more power semiconductor dies to a top main face of a substrate (Block 200). A plastic housing is attached to the substrate (Block 202). The plastic housing and the substrate together enclose the one or more power semiconductor dies. A plurality of power terminals is attached to the top main face of the substrate at a first end (Block 204). Each power terminal extends through the plastic housing at a second end to provide a point of external electrical connection for the one or more power semiconductor dies. Each power semiconductor die, the top main face of the substrate and at least part of the first end of each power terminal are embedded in a potting compound (Block 206). Prior to attaching the power terminals to the first main face of the substrate, an insulative coating is applied only to parts of the power terminals to be disposed inside the plastic housing and in contact with just air (Block 208).

The selectively applied insulative coating described herein can comprise one or more layers of electrically insulative material. In one embodiment, the insulative coating comprises a polyimide applied only to the parts of the power terminals to be disposed inside the plastic housing and in contact with just air.

In addition or alternatively, the insulative coating comprises dried paint, a plastic material or a dried lacquer. According to this embodiment, the paint, plastic material or lacquer is applied only to the parts of each power terminal to be disposed inside the plastic housing and in contact with just air. The paint, plastic material or lacquer is then dried by solvent evaporation or a curing process.

In addition or alternatively, the insulative coating comprises an adhesive tape or film applied only to the parts of the power terminals to be disposed inside the plastic housing and in contact with just air.

In addition or alternatively, the insulative coating is applied by powder coating only to the parts of the power terminals to be disposed inside the plastic housing and in contact with just air.

Yet other coating methods can be used, depending on the type of insulative coating.

In the case of the insulative material being applied as a solvent and then dried such as the case with paint, a plastic material, spray-on lacquer, etc., the parts of the power terminals not to be coated can be masked before the insulative material is applied. A blanket coverage of the insulative material is applied to the power terminals after the mask is applied, and the mask is then removed with the insulative material applied to the mask. In another embodiment, the insulative material can be blanket deposited on the power terminals and then selectively removed from the parts of the power terminals to be disposed inside the plastic housing and in contact with the plastic housing or the potting compound. In yet another embodiment, the insulative material can be selectively applied by a transfer printing process onto only the parts of the power terminals to be disposed inside the plastic housing and in contact with just air.

In the case of the insulative material being applied as a glue or foil, a tape or adhesive film such as a polyimide tape can be glued only to the parts of the power terminals to be disposed inside the plastic housing and in contact with just air. An adhesion promoter can be used to increase the adhesive bond between the insulative coating and the power terminals.

In the case of the insulative material being applied by powder coating, any standard powder coating process can be used.

In general, any material which can be transferred to the surface of the power terminals and has the insulating characteristic needed for the application can be used as the insulative coating described herein.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power semiconductor module, comprising:
   one or more power semiconductor dies attached to a first main face of a substrate;
   a plastic housing attached to the substrate, the plastic housing and the substrate together enclosing the one or more power semiconductor dies;
   a plurality of power terminals attached to the first main face of the substrate at a first end, and extending through the plastic housing at a second end to provide a point of external electrical connection for the one or more power semiconductor dies;
   a potting compound embedding the one or more power semiconductor dies, the first main face of the substrate and at least part of the first end of the plurality of power terminals; and an insulative coating applied only to parts of the plurality of power terminals disposed inside the plastic housing and in contact with just air.

2. The power semiconductor module of claim 1, wherein the potting compound comprises a thermosetting plastic or a silicone gel.

3. The power semiconductor module of claim 1, wherein the insulative coating comprises a polyimide.

4. The power semiconductor module of claim 1, wherein the insulative coating comprises dried paint, a plastic material or a dried lacquer.

5. The power semiconductor module of claim 1, wherein the insulative coating comprises an adhesive tape or film.

6. The power semiconductor module of claim 1, wherein the insulative coating comprises a powder coating.

7. The power semiconductor module of claim 1, wherein each power terminal of the plurality of power terminals comprises a metal plate between the first and the second ends of the power terminal, the metal plate extending in a direction generally perpendicular to the first main face of the substrate.

8. The power semiconductor module of claim 7, wherein the potting compound terminates before reaching the metal plate of each power terminal of the plurality of power terminals so that each metal plate is completely uncovered by the potting compound.

9. The power semiconductor module of claim 8, wherein the insulative coating is applied to a first part of each metal plate nearest the potting compound but not to a second part of each metal plate above the first part and in contact with the plastic housing.

10. The power semiconductor module of claim 7, wherein the insulative coating is applied to a first part of each metal plate nearest the potting compound but not to a second part of each metal plate above the first part and in contact with the plastic housing.

11. A method of manufacturing a power semiconductor module, the method comprising:
   attaching one or more power semiconductor dies to a first main face of a substrate;
   attaching a plastic housing to the substrate, the plastic housing and the substrate together enclosing the one or more power semiconductor dies;
   attaching a plurality of power terminals to the first main face of the substrate at a first end, each power terminal extending through the plastic housing at a second end to provide a point of external electrical connection for the one or more power semiconductor dies;
   embedding the one or more power semiconductor dies, the first main face of the substrate and at least part of the first end of the plurality of power terminals in a potting compound; and
   prior to attaching the plurality of power terminals to the first main face of the substrate, applying an insulative coating only to parts of the plurality of power terminals to be disposed inside the plastic housing and in contact with just air.

12. The method of claim 11, wherein applying the insulative coating only to parts of the plurality of power terminals to be disposed inside the plastic housing and in contact with just air comprises:
   applying polyimide only to the parts of the plurality of power terminals to be disposed inside the plastic housing and in contact with just air.

13. The method of claim 11, wherein applying the insulative coating only to parts of the plurality of power terminals to be disposed inside the plastic housing and in contact with just air comprises:
   applying paint, a plastic material or a lacquer only to the parts of the plurality of power terminals to be disposed inside the plastic housing and in contact with just air; and
   drying the paint, plastic material or lacquer by solvent evaporation or a curing process.

14. The method of claim 11, wherein applying the insulative coating only to parts of the plurality of power terminals to be disposed inside the plastic housing and in contact with just air comprises:
   applying an adhesive tape or film only to the parts of the plurality of power terminals to be disposed inside the plastic housing and in contact with just air.

15. The method of claim 11, wherein applying the insulative coating only to parts of the plurality of power terminals to be disposed inside the plastic housing and in contact with just air comprises:
   powder coating only the parts of the plurality of power terminals to be disposed inside the plastic housing and in contact with just air.

16. The method of claim 11, wherein applying the insulative coating only to parts of the plurality of power terminals to be disposed inside the plastic housing and in contact with just air comprises:
   applying a blanket coverage of insulative material to the plurality of power terminals; and
   removing the insulative material from parts of the plurality of power terminals to be disposed inside the plastic housing and in contact with the plastic housing or the potting compound.

17. The method of claim 11, wherein applying the insulative coating only to parts of the plurality of power terminals to be disposed inside the plastic housing and in contact with just air comprises:
   applying a mask to the parts of the plurality of power terminals to be disposed inside the plastic housing and in contact with just air;
   applying a blanket coverage of insulative material to the plurality of power terminals after the mask is applied; and
   removing the mask with the insulative material applied to the mask.

18. The method of claim 11, wherein applying the insulative coating only to parts of the plurality of power terminals to be disposed inside the plastic housing and in contact with just air comprises:
   transfer printing an insulative material onto only the parts of the plurality of power terminals to be disposed inside the plastic housing and in contact with just air.

19. The method of claim 11, wherein each power terminal of the plurality of power terminals comprises a metal plate between the first and the second ends of the power terminal, the metal plate extending in a direction generally perpendicular to the first main face of the substrate.

20. The method of claim 19, further comprising:
   terminating the potting compound before the potting compound reaches the metal plate of each power terminal of the plurality of power terminals, so that each metal plate is completely uncovered by the potting compound.

21. The method of claim 11, wherein applying the insulative coating only to parts of the plurality of power terminals to be disposed inside the plastic housing and in contact with just air comprises:
applying the insulative coating to a first part of each metal plate to be disposed nearest the potting compound, but not to a second part of each metal plate above the first part and to be in contact with the plastic housing.

22. The method of claim 19, wherein applying the insulative coating only to parts of the plurality of power terminals to be disposed inside the plastic housing and in contact with just air comprises:
applying the insulative coating to a first part of each metal plate to be disposed nearest the potting compound, but not to a second part of each metal plate above the first part and to be in contact with the plastic housing.

\* \* \* \* \*